United States Patent
Kim

(10) Patent No.: US 10,665,279 B2
(45) Date of Patent: May 26, 2020

(54) MEMORY DEVICE WITH TWO COLUMN ADDRESS DECODERS AND LATCHES

(71) Applicant: SK hynix Inc., Gyeonggi-do (KR)

(72) Inventor: Tae-Kyun Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/186,367

(22) Filed: Nov. 9, 2018

(65) Prior Publication Data
US 2019/0267061 A1    Aug. 29, 2019

(30) Foreign Application Priority Data

Feb. 23, 2018  (KR) .................. 10-2018-0021668

(51) Int. Cl.
| | | |
|---|---|---|
| G11C 8/18 | (2006.01) | |
| G11C 8/12 | (2006.01) | |
| G11C 7/06 | (2006.01) | |
| G11C 7/10 | (2006.01) | |
| G11C 8/10 | (2006.01) | |

(52) U.S. Cl.
CPC .............. *G11C 8/18* (2013.01); *G11C 7/06* (2013.01); *G11C 7/1096* (2013.01); *G11C 8/10* (2013.01); *G11C 8/12* (2013.01)

(58) Field of Classification Search
None
See application file for complete search history.

(56) References Cited

U.S. PATENT DOCUMENTS

| | | | | |
|---|---|---|---|---|
| 4,685,088 A * | 8/1987 | Iannucci | ............... | G06F 13/161 |
| | | | | 365/189.02 |
| 5,625,590 A * | 4/1997 | Choi | ..................... | G11C 5/025 |
| | | | | 365/185.17 |
| 5,780,890 A * | 7/1998 | Hazama | ............. | G11C 16/0491 |
| | | | | 257/316 |
| 5,991,223 A * | 11/1999 | Kozaru | ................ | G11C 7/1018 |
| | | | | 365/230.03 |
| 6,362,994 B1 * | 3/2002 | Raad | ...................... | G11C 5/025 |
| | | | | 365/230.06 |
| 6,504,221 B1 * | 1/2003 | Tran | ....................... | B82Y 10/00 |
| | | | | 257/421 |
| 7,155,581 B2 * | 12/2006 | Elliott | ................. | G06F 9/30043 |
| | | | | 711/155 |
| 7,630,271 B2 | 12/2009 | Kim et al. | | |
| 2001/0008282 A1 * | 7/2001 | Maeda | ................. | G11C 7/1072 |
| | | | | 257/1 |
| 2005/0232001 A1 * | 10/2005 | Tsuji | ....................... | G11C 11/16 |
| | | | | 365/158 |

(Continued)

*Primary Examiner* — J. H. Hur
(74) *Attorney, Agent, or Firm* — IP & T Group LLP

(57) ABSTRACT

A memory device includes a memory bank; a first latch circuit positioned at the one side of the memory bank, for latching a first column address in synchronization with a first strobe signal; a second latch circuit positioned at the other side of the memory bank, for latching a second column address in synchronization with a second strobe signal; a first column decoder positioned at the one side of the memory bank, for generating first column select signals in synchronization with the first strobe signal and the first column address; and a second column decoder positioned at the other side of the memory bank, for generating second column select signals in synchronization with the second strobe signal and the second column address.

15 Claims, 4 Drawing Sheets

(56) References Cited

U.S. PATENT DOCUMENTS

| | | | | |
|---|---|---|---|---|
| 2006/0273457 A1* | 12/2006 | Sel | ........................ | H01L 27/105 257/734 |
| 2010/0238709 A1* | 9/2010 | Eun | ......................... | G11C 8/10 365/148 |
| 2013/0294141 A1* | 11/2013 | Oh | ......................... | G11C 17/18 365/96 |

* cited by examiner

MEMORY DEVICE WITH TWO COLUMN ADDRESS DECODERS AND LATCHES

CROSS-REFERENCE TO RELATED APPLICATION

This application claims priority under 35 U.S.C. § 119 to Korean Patent Application No. 10-2018-0021668, filed on Feb. 23, 2018, which is incorporated herein by reference in its entirety.

BACKGROUND

1. Field

The present invention relates to a memory device and a method of operating a memory device.

2. Discussion of the Related Art

Generally, an addressing operation of a memory device such as a dynamic random access memory (DRAM) may be divided into a row addressing operation and a column addressing operation.

The row addressing operation may include selecting a word line to be accessed by a row address, and then amplifying data stored in memory cells corresponding to the selected word line through a bit line amplifier. The row addressing operation may be performed during an active operation of the memory device.

The column addressing operation may include decoding a column address to activate one of column select signals, and inputting and/or outputting data through a data bus coupled to bit lines corresponding to the activated column select signal. The column addressing operation may be performed during read and write operations of the memory device.

SUMMARY

Various embodiments are directed to a technique for stabilizing a column addressing operation of a memory device.

In an embodiment, a memory device may include: a memory bank; a first strobe transfer path suitable for transferring a strobe signal to one side of the memory bank; a second strobe transfer path suitable for transferring the strobe signal to the other side of the memory bank; a first column address transfer path suitable for transferring a column address to the one side of the memory bank; a second column address transfer path suitable for transferring the column address to the other side of the memory bank; a first latch circuit positioned at the one side of the memory bank, suitable for latching the column address transferred through the first column address transfer path in synchronization with the strobe signal transferred through the first strobe transfer path; a second latch circuit positioned at the other side of the memory bank, suitable for latching the column address transferred through the second column address transfer path in synchronization with the strobe signal transferred through the second strobe transfer path; a first column decoder positioned at the one side of the memory bank, suitable for generating first column select signals using the strobe signal transferred through the first strobe transfer path and the column address latched in the first latch circuit; and a second column decoder positioned at the other side of the memory bank, suitable for generating second column select signals using the strobe signal transferred through the second strobe transfer path and the column address latched in the second latch circuit.

In an embodiment, a memory device may include: a memory bank; a first latch circuit positioned at one side of the memory bank, and suitable for latching a first column address in synchronization with a first strobe signal; a second latch circuit positioned at the other side of the memory bank, suitable for latching a second column address in synchronization with a second strobe signal; a first column decoder positioned at the one side of the memory bank, suitable for generating first column select signals in synchronization with the first strobe signal and the first column address; and a second column decoder positioned at the other side of the memory bank, suitable for generating second column select signals in synchronization with the second strobe signal and the second column address.

In an embodiment, a method of operating a memory device includes: transferring a strobe signal to one side of a memory bank of the memory device; transferring the strobe signal to the other side of the memory bank; transferring a column address to the one side of the memory bank; transferring the column address to the other side of the memory bank; latching the column address transferred through the first column address transfer path in synchronization with the strobe signal transferred through the first strobe transfer path, using a first latch circuit positioned at the one side of the memory bank; latching the column address transferred through the second column address transfer path in synchronization with the strobe signal transferred through the second strobe transfer path, using a second latch circuit positioned at the other side of the memory bank; generating first column select signals using the strobe signal transferred through the first strobe transfer path and the column address latched in the first latch circuit, using a first column decoder positioned at the one side of the memory bank; and generating second column select signals using the strobe signal transferred through the second strobe transfer path and the column address latched in the second latch circuit, using a second column decoder positioned at the other side of the memory bank.

DETAILED DESCRIPTION

Figure 1:
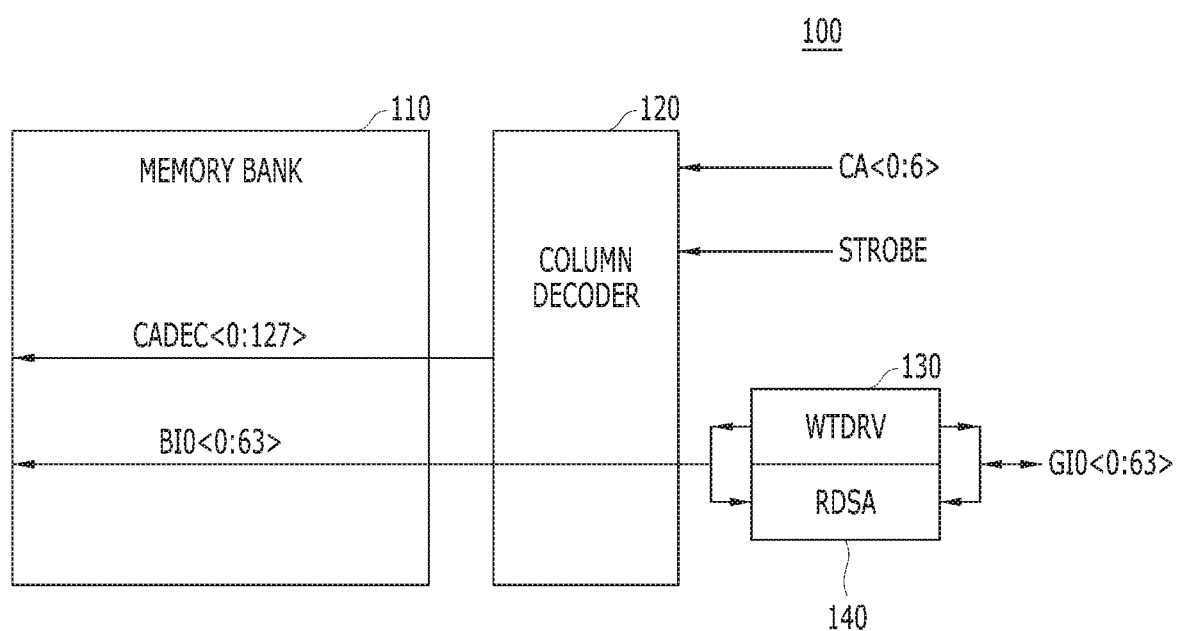
FIG. 1 is a diagram illustrating a memory device in accordance with an embodiment.

Various embodiments are described below in more detail with reference to the accompanying drawings. The present invention may, however, be embodied in different forms and should not be construed as limited to the embodiments set forth herein. Rather, these embodiments are provided so that this disclosure is thorough and complete and fully conveys the scope of the present invention to those skilled in the art. Throughout the disclosure, like reference numerals refer to like parts throughout the various figures and embodiments of the present invention. Also, throughout the specification, reference to "an embodiment," "another embodiment" or the like is not necessarily to only one embodiment, and different references to any such phrases are not necessarily to the same embodiment(s). Further, reference to a "side," e.g., "one side," "the other side," "right side," "left side," and the like are relative terms used to distinguish two sides, not to identify a specific side. Moreover, directional terms "right" and "left" are used with reference to structure shown in the applicable figure.

FIG. 1 is a diagram illustrating a memory device 100 in accordance with an embodiment. In particular, FIG. 1 illustrates a portion of the memory device 100 which is related to a column addressing operation.

Referring to FIG. 1, the memory device 100 may include a memory bank 110, a column decoder 120, a write driver (WTDRV) 130 and a read sense amplifier (RDSA) 140.

The memory bank 110 may include a large number of memory cells for storing data. The memory bank 110 may be divided into a plurality of cell blocks, and each of the cell blocks may include a plurality of memory cells. The memory device 100 may include a plurality of memory banks. For clarity, FIG. 1 illustrates only one memory bank 110.

The write driver 130 may be used to transfer data of a global data bus GIO<0:63> to a local data bus BIO<0:63> during a write operation. The read sense amplifier 140 may be used to transfer data of the local data bus BIO<0:63> to the global data bus GIO<0:63> during a read operation. The global data bus GIO<0:63> may be shared by the plurality of memory banks, and data may be transmitted between the memory banks and a data transmitter/receiver circuit of the memory device 100 through the global data bus GIO<0:63>. The local data bus BIO<0:63> may be separately installed for each of the memory banks, and data read from or written to the corresponding memory bank may be transmitted through its associated local data bus BIO<0:63>.

The column decoder 120 may generate column select signals CADEC<0:127> using a column address CA<0:6> and a strobe signal STROBE. The column decoder 120 may decode the column address CA<0:6> and determine one column select signal to activate among the column select signals CADEC<0:127>. During an active period of the strobe signal STROBE, the column decoder 120 may activate the determined column select signal.

The column select signals CADEC<0:127> may be transferred to memory blocks in the memory bank 110, and used to select columns (i.e., bit lines) through which data are to be inputted to/outputted from the memory blocks, i.e. columns to be electrically coupled to the local data bus BIO<0:63>.

The column select signals CADEC<0:127> may be transferred from right to left, because the column decoder 120 is positioned at the right side of the memory bank 110. Since the memory bank 110 has a considerably large physical size, the column select signals CADEC<0:127> transferred to memory blocks close to the right side of the memory bank 110 likely do not have the same characteristic as the column select signals CADEC<0:127> transferred to memory blocks close to the left side of the memory bank 110. Depending on positions within the memory bank 110, the column select signals CADEC<0:127> may be transferred at different timings and have different signal strengths. The characteristic differences among the column select signals CADEC<0:127>, depending on the positional differences in the memory bank 110, may destabilize the column addressing operation of the memory bank 110. In this case, a data input/output operation may also be unstably performed.

Figure 2:
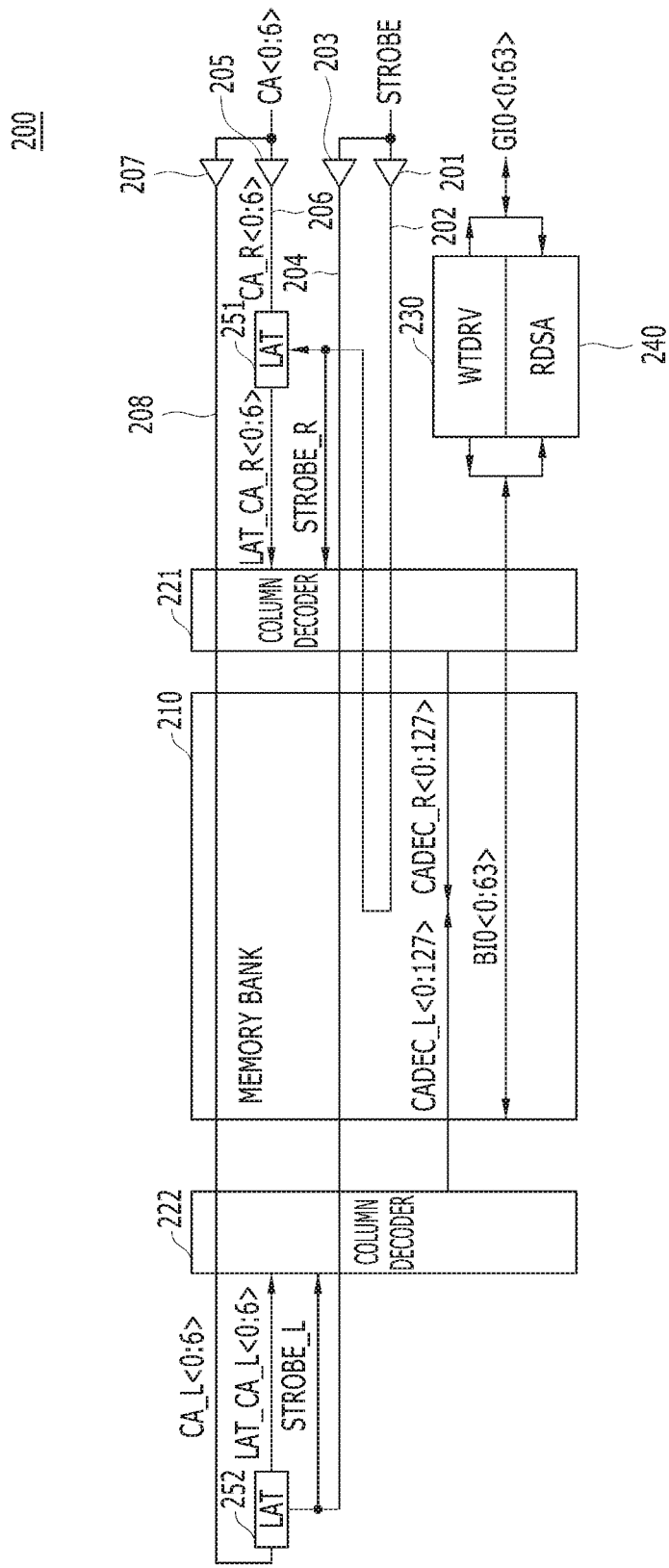
FIG. 2 is a diagram illustrating a memory device in accordance with another embodiment.

FIG. 2 is a diagram illustrating a memory device 200 in accordance with another embodiment. In particular, FIG. 2 illustrates a portion of the memory device 200, which is related to the column addressing operation.

Referring to FIG. 2, the memory device 200 may include a memory bank 210, a first column decoder 221, a second column decoder 222, a write driver (WTDRV) 230, a read sense amplifier (RASA) 240, a first latch circuit 251 and a second latch circuit 252.

The memory bank 210 may include a large number of memory cells for storing data. The memory bank 210 may be divided into a plurality of cell blocks, and each of the cell blocks may include a plurality of memory cells. The memory device 200 may include a plurality of memory banks. For clarity, FIG. 2 illustrates only one memory bank 210.

The write driver 230 may be used to transfer data of a global data bus GIO<0:63> to a local data bus BIO<0:63> during a write operation. The read sense amplifier 240 may be used to transfer data of the local data bus BIO<0:63> to the global data bus GIO<0:63> during a read operation. The global data bus GIO<0:63> may be shared by the plurality of memory banks, and data may be transmitted between the memory banks and a data transmitter/receiver circuit of the memory device 200 through the global data bus GIO<0:63>. The local data bus BIO<0:63> may be separately installed for each of the memory banks, and data read from and written to the corresponding memory bank may be transmitted through its associated local data bus BIO<0:63>.

The strobe signal STROBE may be transferred to one side (for example, right side) of the memory bank 210 through a first strobe transfer path including a repeater 201 and a transmission line 202. Also, the strobe signal STROBE may be transferred to the other side (for example, left side) of the memory bank 210 through a second strobe transfer path including a repeater 203 and a transmission line 204.

The first strobe transfer path 201, 202 may originate from one side of the memory bank 210, and terminate at the right side of the memory bank 210 via the middle between the right side and the left side of the memory bank 210. The reason to form the first strobe transfer path 201, 202 in such a manner is in order to equalize the lengths of the first strobe transfer path 201, 202 and the second strobe transfer path 203, 204 as much as possible. Hereafter, the strobe signal STROBE transferred through the first strobe transfer path 201, 202 may be referred to as a first strobe signal STROBE_R for convenience.

The second strobe transfer path 203, 204 may originate from the right side of the memory bank 210 and terminate at the left side of the memory bank 220. Hereafter, the strobe signal STROBE transferred through the second strobe transfer path 203, 204 may be referred to as a second strobe signal STROBE_L for convenience. In various embodiments, the lengths of the first strobe transfer path 201, 202 and the second strobe transfer path 203, 204 may be set to be equal. Alternatively, the lengths of the first strobe transfer path 201, 202 and the second strobe transfer path 203, 204 may be set to be substantially equal or as equal as possible. For example, the shorter of the two transfer paths may have a length that is 90% of the longer path. FIG. 2 illustrates that each of the first strobe transfer path 201, 202 and the second strobe transfer path 203, 204 includes one repeater: 201 and 203, respectively. However, the number of repeaters in either transfer path is not limited thereto. The first strobe transfer path 201, 202 and the second strobe transfer path 203, 204 may further include a delay circuit for timing control.

The column address CA<0:6> may be transferred to the right side of the memory bank 210 through a first column address transfer path 205, 206. Also, the column address CA<0:6> may be transferred to the left side of the memory bank 220 through a second column address transfer path 207, 208.

The first column address transfer path 205, 206 may originate from the right side of the memory bank 210 and terminate at the first latch circuit 251 positioned at the right, e.g., same, side of the memory bank 210. The first column address transfer path 205, 206 may include repeaters 205 and transmission lines 206. If the column address CA<0:6> contains seven bits, the first column address transfer path 205, 206 may include seven repeaters 205 and seven transmission lines 206. Hereafter, the column address CA<0:6> transferred through the first column address transfer path 205, 206 may be referred to as a first column address CA_R<0:6> for convenience.

The second column address transfer path 207, 208 may originate from the right side of the memory bank 210 and terminate at the second latch circuit 252 positioned at the left side of the memory bank 210. The second column address transfer path 207, 208 may include repeaters 207 and transmission lines 208. If the column address CA<0:6> contains seven bits, the second column address transfer path 207, 208 may include seven repeaters 207 and seven transmission lines 208. Hereafter, the column address CA<0:6> transferred through the second column address transfer path 207, 208 may be referred to as a second column address CA_L<0:6> for convenience. The lengths of the first column address transfer path 205, 206 and the second column address transfer path 207, 208 may be set to be different. Since the first column address transfer path 205, 206 transfers the column address CA<0:6> only at the right side of the memory bank 210, the first column address transfer path 205, 206 may have a relatively short length. However, since the second column address transfer path 207, 208 transfers the column address CA<0:6> from the right side to the left side of the memory bank 210, the second column address transfer path 207, 208 may have a relatively long length. For example, the length of the first column address transfer path 205, 206 may be set to a value equal to or less than 50% of the length of the second column address transfer path 207, 208. In various embodiments, the ratio of the length of the first strobe transfer path to the length of the second strobe transfer path is greater than the ratio of the length of the first column address transfer path to the length of the second column address transfer path. FIG. 2 illustrates that each of the first column address transfer path 205, 206 and the second column address transfer path 207, 208 includes seven repeaters 207, but the number of repeaters is not be limited thereto. The first column address transfer path 205, 206 and the second column address transfer path 207, 208 may further include a delay circuit for timing control.

The first latch circuit 251 may be positioned at the right side of the memory bank 210, and latch the first column address CA_R<0:6> in synchronization with the first strobe signal STROBE_R. Specifically, the first latch circuit 251 may receive and latch the first column address CA_R<0:6> at a falling edge of the first strobe signal STROBE_R, and retain the latched first column address CA_R<0:6> until the next falling edge of the first strobe signal STROBE_R. In other words, the first latch circuit 251 may receive and latch the column address CA_R<0:6> transferred through the first column address path at a time at which the strobe signal STROBE_R transferred through the first strobe transfer path transitions from an active state to an inactive state. In some embodiments, the first latch circuit 251 may include seven falling-edge-triggered D flip-flops.

The second latch circuit 252 may be positioned at the left side of the memory bank 210, and latch the second column address CA_L<0:6> in synchronization with the second strobe signal STROBE_L. Specifically, the second latch circuit 252 may receive and latch the second column address CA_L<0:6> at a falling edge of the second strobe signal STROBE_L, and retain the latched second column address CA_L<0:6> till the next falling edge of the second strobe signal STROBE_L. In other words, the second latch circuit 252 may receive and latch the column address CA_L<0:6> transferred through the second column address path at a time at which the strobe signal STROBE_L transferred through the second strobe transfer path transitions from an active state to an inactive state. In some embodiments, the second latch circuit 252 may include seven falling-edge-triggered D flip-flops.

The first column address CA_R<0:6> transferred to the first latch circuit 251 and the second column address CA_L<0:6> transferred to the second latch circuit 252 may be transferred through different column address transfer paths 205, 206 and 207, 208, respectively. Therefore, the timing of the first column address CA_R<0:6> is different from the timing of the second column address CA_L<0:6>. The first and second strobe signals STROBE_R and STROBE_L are transferred to the first and second latch circuits 251 and 252 almost at the same timing, and the first and second latch circuits 251 and 252 are operated in synchronization with the first and second strobe signals STROBE_R and STROBE_L, respectively. Thus, the first and second latch circuits 251 and 252 may respectively latch the first and second column addresses CA_R<0:6> and CA_L<0:6> almost at the same timing. That is, the latched first column address LAT_CA_R<0:6> and the latched second column address LAT_CA_L<0:6> may have the same timing.

The first column decoder 221 may generate first column select signals CADEC_R<0:127> using the latched first column address LAT_CA_R<0:6> and the first strobe signal STROBE_R. The first column decoder 221 may decode the latched first column address LAT_CA_R<0:6> and determine one first column select signal to activate among the first column select signals CADEC_R<0:127>. During an active period of the first strobe signal STROBE_R, the first column decoder 221 may activate the determined first column select signal.

The second column decoder 222 may generate second column select signals CADEC_L<0:127> using the latched second column address LAT_CA_L<0:6> and the second strobe signal STROBE_L. The second column decoder 222 may decode the latched second column address LAT_CA_L<0:6> and determine one second column select signal to activate among the second column select signals CADEC_L<0:127>. During an active period of the second strobe signal STROBE_L, the second column decoder 222 may activate the determined second column select signal.

The latched first column address LAT_CA_R<0:6> and the latched second column address LAT_CA_L<0:6> may be updated at the same timing, and the first strobe signal STROBE_R and the second strobe signal STROBE_L may have the same timing. Therefore, the first and second column decoders 221 and 222 may operate at the same timing. That is, the first column select signals CADEC_R<0:127> and the second column select signals CADEC_L<0:127> may have the same decoding information and the same timing information, except that they are generated through different column decoders 221 and 222.

The first column select signals CADEC_R<0:127> may be transferred to memory blocks positioned close to the right side of the memory bank 210 among the memory blocks of the memory bank 210, and used to select columns (i.e., bit lines) through which data are to be inputted to/outputted from the memory blocks, i.e., columns to be electrically coupled to the local data bus BIO<0:63>. The second column select signals CADEC_L<0:127> may be transferred to memory blocks positioned close to the left side of the memory bank 210 among the memory blocks of the memory bank 210, and used to select columns (i.e., bit lines) through which data are to be inputted to/outputted from the memory blocks, i.e., columns to be electrically coupled to the local data bus BIO<0:63>. As such, the memory blocks positioned close to the right side of the memory bank 210 perform a column addressing operation according to the first column select signals CADEC_R<0:127> transferred from the right side, whereas the memory blocks positioned close to the left side of the memory bank 210 perform a column addressing operation according to the second column select signals CADEC_L<0:127> transferred from the left side. Thus, the column addressing operation of the memory bank 210 may be stably performed. That is, all of the memory blocks regardless of their respective positions within the memory bank 210 may perform the column addressing operation almost at the same timing, according to the column select signals having almost the same signal strength. Furthermore, since the stability of the column addressing operation can be guaranteed, a stable operation may be expected even though the address window is reduced or the operating speed is increased.

Figure 3:
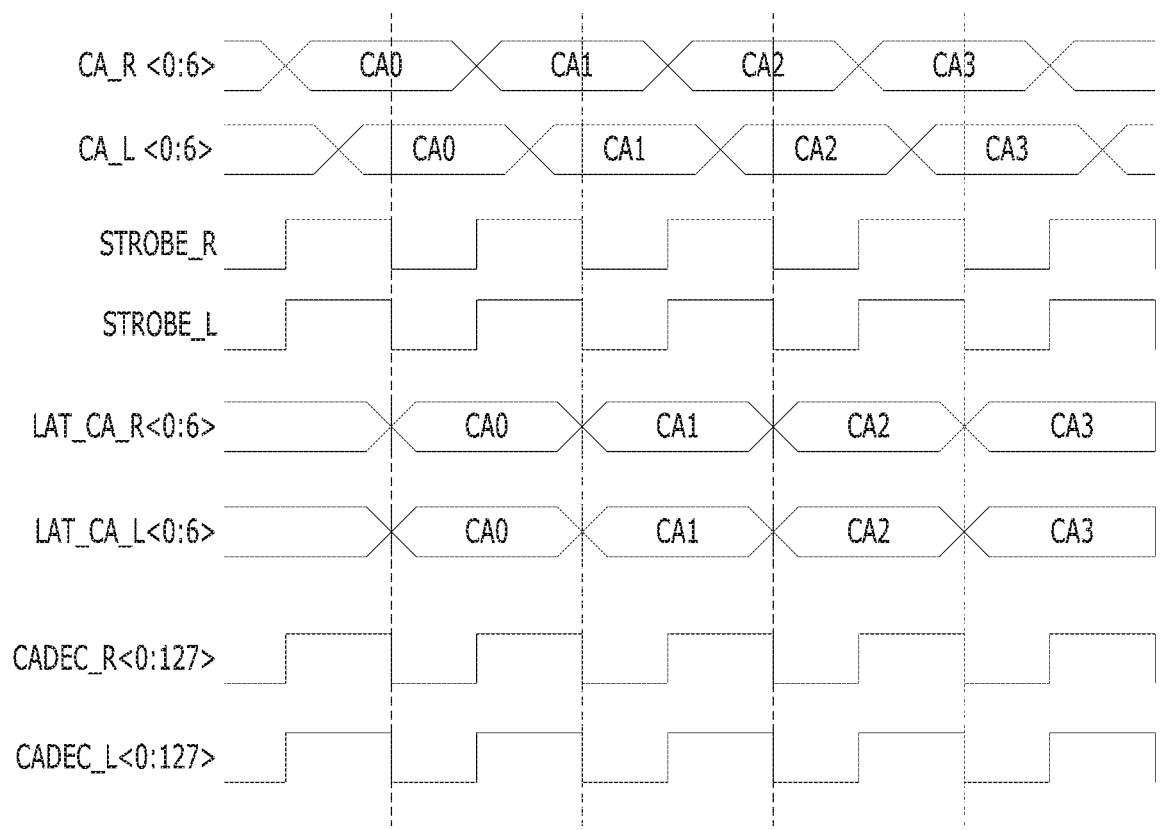
FIG. 3 is a timing diagram illustrating a column addressing operation of a memory device in accordance with an embodiment.

FIG. 3 is a timing diagram illustrating a column addressing operation of a memory device in accordance with an embodiment, for example, the column addressing operation of the memory device 200 of FIG. 2. FIG. 3 illustrates the case in which read or write operations are consecutively performed.

Referring to FIG. 3, the first and second column addresses CA_R<0:6> and CA_L<0:6> may have different timings because they are transferred through different paths having different lengths. Here, column address CA1 may represent a column address applied to the memory device 200 after column address CA0, and column address CA2 may represent a column address applied after column address CA1.

Since the first and second strobe signals STROBE_R and STROBE_L are transferred through paths having almost the same length, the first and second strobe signals STROBE_R and STROBE_L may have the same timing.

Since the first latch circuit 251 latches the first column address CA_R<0:6> at a falling edge of the first strobe signal STROBE_R, the latched first column address LAT_CA_R<0:6> may be updated at each falling edge of the first strobe signal STROBE_R. Furthermore, since the second latch circuit 252 latches the second column address CA_L<0:6> in synchronization with a falling edge of the second strobe signal STROBE_L, the latched second column address LAT_CA_L<0:6> may be updated at each falling edge of the second strobe signal STROBE_L. Since the first and second strobe signals STROBE_R and STROBE_L have the same timing, the latched first and second column addresses LAT_CA_R<0:6> and LAT_CA_L<0:6> may have the same timing.

The first column decoder 221 may generate the first column select signals CADEC_R<0:127> using the latched first column address LAT_CA_R<0:6> and the first strobe signal STROBE_R, whereas the second column decoder 222 may generate the second column select signals CADEC_L<0:127> using the latched second column address LAT_CA_L<0:6> and the second strobe signal STROBE_L. In this case, the latched first column address LAT_CA_R<0:6> and the latched second column address LAT_CA_L<0:6> are the same addresses having the same information and timing, and the first and second strobe signals STROBE_R and STROBE_L have the same timing information. Thus, the first column select signals CADEC_R<0:127> and the second column select signals CADEC_L<0:127> may be generated as the same signals. FIG. 3 illustrates the timings at which one first column select signal is activated among the first column select signals CADEC_R<0:127> and the timings at which one second column select signal is activated among the second column select signals CADEC_L<0:127>. Referring to FIG. 3, the signal activated among the first column select signals CADEC_R<0:127> and the signal activated among the second column select signals CADEC_L<0:127> may be activated at the same timings.

Figure 4:
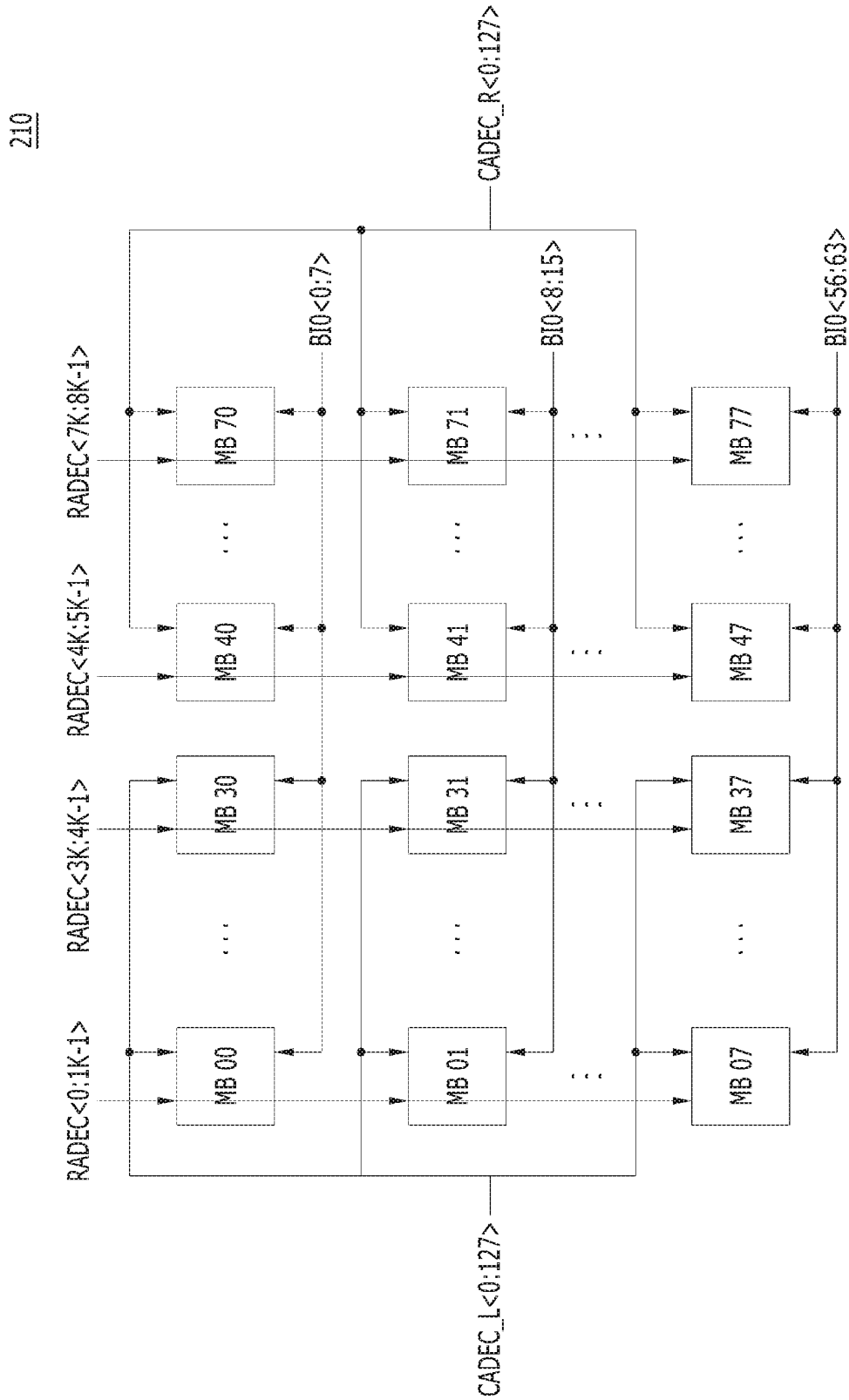
FIG. 4 is a diagram illustrating a memory bank in accordance with an embodiment.

FIG. 4 is a diagram illustrating a memory bank in accordance with an embodiment, for example, the memory bank 210 of FIG. 2.

Referring to FIG. 4, the memory bank 210 may include 64 memory blocks MB00 to MB77.

Each of the memory blocks MB00 to MB77 may include 1K rows (i.e., 1K word lines) and 1K columns (i.e. 1K bit lines), where K is 1024. Therefore, one memory block may have a capacity of 1 Mb (=1K*1K), and the memory bank 210 may thus have a total capacity of 64 Mb. Currently, one memory bank may have a capacity of 1 Gb to several Gb, and the present invention may accommodate such capacity. In the illustrated embodiment, however, the capacity of the memory bank is given as 64 Mb for clarity of illustration and convenience of description.

In the embodiment of FIG. 4, 8K row select signals RADEC<0:8K-1> may be used to select rows from the memory blocks MB00 to MB77. Among the 8K row select signals, one signal may be activated to select the corresponding row. The rows of the memory blocks MB00 to MB07 may be selected by 1K row select signals RADEC<0:1K-1>, and the rows of the memory blocks MB10 to MB17 may be selected by 1K row select signals RADEC<1K:2K-1>.

Among the memory blocks MB00 to MB77, the columns of 32 memory blocks MB00 to MB37 close to the left side of the memory bank 210 may be selected by the second column select signals CADEC_L<0:127>, whereas the columns of 32 memory blocks MB40 to MB77 close to the right side of the memory bank 210 may be selected by the first column select signals CADEC_R<0:127>. Each of the memory blocks MB00 to MB77 may include 1K columns, and the number of the column select signals CADEC_L<0:127> or CADEC_R<0:127> may be set to 128. This is because the ratio of the 1K columns to the 128 column select signals CADEC_L<0:127> or CADEC_R<0:127> corresponds to 8:1. For example, when one column select signal is activated, eight columns corresponding to the column select signal may be selected in one memory block, and the selected columns may be coupled to the local data bus BIO<0:63> to input and output data.

Three situations may be exemplified to describe which rows and columns are selected in the memory blocks MB00 to MB77 and which data are inputted and outputted.

(1) When RADEC<0>, CADEC_R<0> and CADEC_L<0> are activated:

Since the row select signal RADEC<0> is activated, the zeroth row may be selected from the memory blocks MB00 to MB77. Since the second column select signal CADEC_L<0> is activated, the zeroth to seventh columns may be selected from the memory blocks MB00 to MB07. The zeroth to seventh columns of the memory block MB00 may be coupled to the local data bus BIO<0:7>, and the zeroth to seventh columns of the memory block MB01 may be coupled to the local data bus BIO<8:15>. Similarly, the zeroth to seventh columns of the memory block MB07 may be coupled to the local data bus BIO<56:63>.

(2) When RADEC<3K−1>, CADEC_R<1> and CADEC_L<1> are activated:

Since the row select signal RADEC<3K−1> is activated, the 1023rd row may be selected from the memory blocks MB20 to MB27. Since the second column select signal CADEC_L<1> is activated, the eighth to 15th columns may be selected from the memory blocks MB20 to MB27. The eighth to 15th columns of the memory block MB20 may be coupled to the local data bus BIO<0:7>, and the eighth to 15th columns of the memory block MB21 may be coupled to the local data bus BIO<8:15>. Similarly, the eighth to 15th columns of the memory block MB27 may be coupled to the local data bus BIO<56:63>.

(3) When RADEC<4K+1>, CADEC_R<127> and CADEC_L<127> are activated:

Since the row select signal RADEC<4K+1> is activated, the first row may be selected from the memory blocks MB40 to MB47. Since the first column select signal CADEC_R<127> is activated, the 1016th to 1023rd columns may be selected from the memory blocks MB40 to MB47. The 1016th to 1023rd columns of the memory block MB40 may be coupled to the local data bus BIO<0:7>, and the 1016th to 1023rd columns of the memory block MB41 may be coupled to the local data bus BIO<8:15>. Similarly, the 1016th to 1023rd columns of the memory block MB47 may be coupled to the local data bus BIO<56:63>.

In accordance with embodiments, the column addressing operation of the memory device can be more stably performed.

Although various embodiments have been described for illustrative purposes, it will be apparent to those skilled in the art that various changes and modifications may be made without departing from the spirit and scope of the invention as defined in the following claims.

What is claimed is:

1. A memory device comprising:
a memory bank;
a first strobe transfer path suitable for transferring a strobe signal to one side of the memory bank;
a second strobe transfer path suitable for transferring the strobe signal to another side of the memory bank;
a first column address transfer path suitable for transferring a column address to the one side of the memory bank;
a second column address transfer path suitable for transferring the column address to the another side of the memory bank;
a first latch circuit, positioned at the one side of the memory bank, suitable for latching the column address transferred through the first column address transfer path in synchronization with the strobe signal transferred through the first strobe transfer path;
a second latch circuit, positioned at the another side of the memory bank, suitable for latching the column address transferred through the second column address transfer path in synchronization with the strobe signal transferred through the second strobe transfer path;
a first column decoder, positioned at the one side of the memory bank, suitable for generating first column select signals using the strobe signal transferred through the first strobe transfer path and the column address latched in the first latch circuit; and
a second column decoder, positioned at the another side of the memory bank, suitable for generating second column select signals using the strobe signal transferred through the second strobe transfer path and the column address latched in the second latch circuit,
wherein the ratio of the length of the first strobe transfer path to the length of the second strobe transfer path is greater than the ratio of the length of the first column address transfer path to the length of the second column address transfer path.

2. The memory device of claim 1, wherein the memory bank comprises a plurality of memory blocks, and
columns of some memory blocks among the plurality of memory blocks are selected by the first column select signals, and columns of other memory blocks among the plurality of memory blocks are selected by the second column select signals.

3. The memory device of claim 2, wherein the some memory blocks are positioned closer to the one side of the memory bank than the other memory blocks.

4. The memory device of claim 2, further comprising:
a write driver suitable for transferring data of a global data bus to a local data bus; and
a read sense amplifier suitable for transferring data of the local data bus to the global data bus,
wherein the first and second column select signals are used to select columns through which data are transmitted to and received from the local data bus, from memory blocks selected among the plurality of memory blocks.

5. The memory device of claim 1, wherein the first latch circuit receives and latches the column address transferred through the first column address path at a time at which the strobe signal transferred through the first strobe transfer path transitions from an active state to an inactive state, and
the second latch circuit receives and latches the column address transferred through the second column address path at a time at which the strobe signal transferred through the second strobe transfer path transitions from an active state to an inactive state.

6. The memory device of claim 5, wherein the first column decoder determines a first column select signal to activate among the first column select signals by decoding the column address transferred through the first column address transfer path, and activates the determined first column select signal during an active period of the strobe signal transferred through the first strobe transfer path, and
the second column decoder determines a second column select signal to activate among the second column select signals by decoding the column address transferred through the second column address transfer path, and activates the determined second column select signal during an active period of the strobe signal transferred through the second strobe transfer path.

7. A memory device comprising:
a memory bank;
a first strobe transfer path suitable for transferring a strobe signal to one side of the memory bank;
a second strobe transfer path suitable for transferring the strobe signal to another side of the memory bank;
a first column address transfer path suitable for transferring a column address to the one side of the memory bank;

a second column address transfer path suitable for transferring the column address to the another side of the memory bank;

a first latch circuit, positioned at the one side of the memory bank, suitable for latching the column address transferred through the first column address transfer path in synchronization with the strobe signal transferred through the first strobe transfer path;

a second latch circuit, positioned at the another side of the memory bank, suitable for latching the column address transferred through the second column address transfer path in synchronization with the strobe signal transferred through the second strobe transfer path;

a first column decoder, positioned at the one side of the memory bank, suitable for generating first column select signals using the strobe signal transferred through the first strobe transfer path and the column address latched in the first latch circuit; and a second column decoder, positioned at the another side of the memory bank, suitable for generating second column select signals using the strobe signal transferred through the second strobe transfer path and the column address latched in the second latch circuit, wherein the shorter path of the first and second strobe transfer paths has a length greater than or equal to 90% of the length of the longer path, and the shorter path of the first and second column address transfer paths has a length less than or equal to 50% of the length of the longer path.

8. A memory device comprising:
a memory bank;
a first strobe transfer path suitable for transferring a strobe signal to one side of the memory bank;
a second strobe transfer path suitable for transferring the strobe signal to another side of the memory bank;
a first column address transfer path suitable for transferring a column address to the one side of the memory bank;
a second column address transfer path suitable for transferring the column address to the another side of the memory bank;
a first latch circuit, positioned at the one side of the memory bank, suitable for latching the column address transferred through the first column address transfer path in synchronization with the strobe signal transferred through the first strobe transfer path;
a second latch circuit, positioned at the another side of the memory bank, suitable for latching the column address transferred through the second column address transfer path in synchronization with the strobe signal transferred through the second strobe transfer path;
a first column decoder, positioned at the one side of the memory bank, suitable for generating first column select signals using the strobe signal transferred through the first strobe transfer path and the column address latched in the first latch circuit; and
a second column decoder, positioned at the another side of the memory bank, suitable for generating second column select signals using the strobe signal transferred through the second strobe transfer path and the column address latched in the second latch circuit,
wherein the first strobe transfer path originates from the one side of the memory bank and terminates at the one side of the memory bank via the middle between the one side and the another side of the memory bank.

9. The memory device of claim 8, wherein the second strobe transfer path originates from the one side of the memory bank and terminates at the another side of the memory bank.

10. A memory device comprising:
a memory bank;
a first latch circuit, positioned at one side of the memory bank, suitable for latching a first column address in synchronization with a first strobe signal;
a second latch circuit, positioned at another side of the memory bank, suitable for latching a second column address in synchronization with a second strobe signal;
a first column decoder, positioned at the one side of the memory bank, suitable for generating first column select signals in synchronization with the first strobe signal and the first column address; and
a second column decoder, positioned at the another side of the memory bank, suitable for generating second column select signals in synchronization with the second strobe signal and the second column address,
wherein the first and second strobe signals are the same strobe signals transferred through different paths, and
the first and second column addresses are the same column addresses transferred through different paths,
the first strobe signal is transferred from the one side of the memory bank to the one side of the memory bank via the middle between the one side and the another side of the memory bank, and
the second strobe signal is transferred from the one side of the memory bank to the another side of the memory bank.

11. The memory device of claim 10, wherein a timing difference between the first and second strobe signals is less than a timing difference between the first and second column addresses.

12. The memory device of claim 10, wherein the first column address is transferred from the one side of the memory bank to the first latch circuit, and
the second column address is transferred from the one side of the memory bank to the second latch circuit.

13. The memory device of claim 10, wherein the memory bank comprises a plurality of memory blocks, and
columns of some memory blocks among the plurality of memory blocks are selected by the first column select signals, and columns of other memory blocks among the plurality of memory blocks are selected by the second column select signals.

14. The memory device of claim 13, wherein the some memory blocks are positioned closer to the one side of the memory bank than the other memory blocks.

15. The memory device of claim 13, further comprising:
a write driver suitable for transferring data of a global data bus to a local data bus; and
a read sense amplifier suitable for transferring data of the local data bus to the global data bus,
wherein the first and second column select signals are used to select columns through which data are transmitted to and received from the local data bus, from memory blocks selected among the plurality of memory blocks.

* * * * *